United States Patent [19]

Axtell, III et al.

[11] 4,271,515

[45] Jun. 2, 1981

[54] UNIVERSAL ANALOG AND DIGITAL TESTER

[75] Inventors: Clyde R. Axtell, III, Sunnyvale; Richard B. Drabing, Santa Clara, both of Calif.

[73] Assignee: John Fluke Mfg. Co., Inc., Mountlake Terrace, Wash.

[21] Appl. No.: 23,370

[22] Filed: Mar. 23, 1979

[51] Int. Cl.³ .................... G01R 31/28; G06F 11/00
[52] U.S. Cl. .................... 371/25; 324/73 R; 364/580
[58] Field of Search .................... 235/302; 324/73 R; 364/580; 371/25

[56] References Cited

U.S. PATENT DOCUMENTS

| | | | |
|---|---|---|---|
| 3,810,012 | 5/1974 | Harris | 324/73 R |
| 3,812,426 | 5/1974 | Illian | 324/73 R |
| 3,821,645 | 6/1974 | Vinsani | 324/73 R |
| 4,044,244 | 8/1977 | Foreman et al. | 235/302 |
| 4,125,763 | 11/1978 | Drabing et al. | 225/302 |
| 4,139,147 | 2/1979 | Franke | 235/302 |
| 4,168,527 | 9/1979 | Winkler | 364/580 |
| 4,176,314 | 11/1979 | Yamada | 324/73 R |

*Primary Examiner*—Charles E. Atkinson
*Attorney, Agent, or Firm*—Townsend and Townsend

[57] ABSTRACT

Method and apparatus for comparison-type testing of electronic devices which generate analog waveform output signals. A reference unit output signal and an output signal of a unit under test are paired and selectively and synchronously compared in response to a common input signal. The comparison is performed by means of subtraction producing an error signal, which error signal is compared against a limit window. The limit window may have fixed or preferably programmable amplitude limits whereby a digital decision signal is generated whenever the limits are exceeded.

11 Claims, 2 Drawing Figures

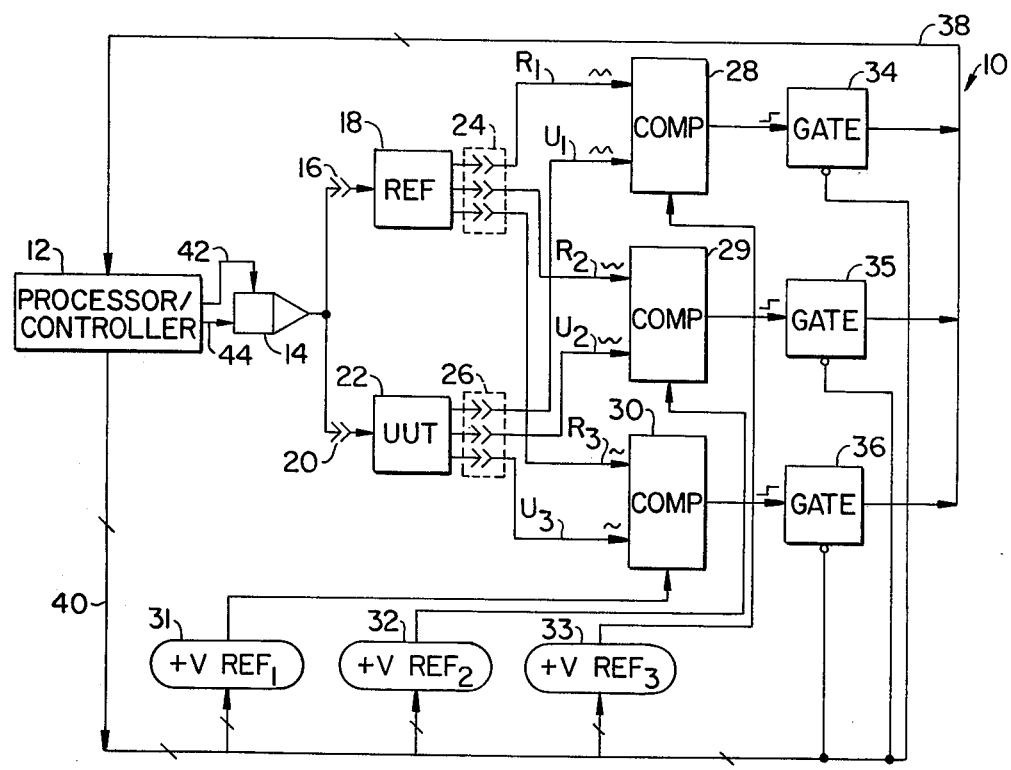
FIG._1.
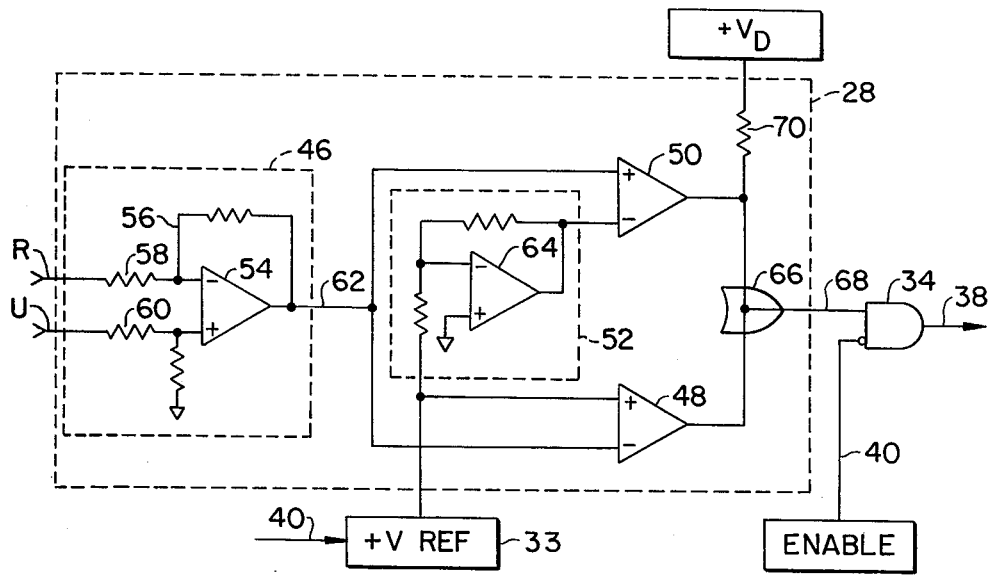
FIG._2.

UNIVERSAL ANALOG AND DIGITAL TESTER

BACKGROUND OF THE INVENTION

1. Field of Invention

This invention relates to testing of analog circuitry. The invention specifically relates to a pass-fail technique for verifying proper operation of an analog circuit in connection with a comparison-type digital circuit tester where the analog output signals of a known good reference circuit are compared in real-time with the corresponding analog output signals of an unknown circuit unit under test to generate a digital pass-fail signal.

Heretofore analog circuits have been tested by inspection of signal levels and waveforms through the use of an oscilloscope or through the use of a digital data base representing an analog waveform. The oscilloscope technique is relatively slow and requires the attention of an operator trained in the use of the oscilloscope in order to identify failures or defects in the circuit under test. Moreover, oscilloscope testing techniques are not easily adapted to high volume assembly line testing since real-time waveform observations are required which are subject to human evaluation and judgmental error.

With the development and relatively wide acceptance of digital circuit technology, there has also developed efficient and high-speed techniques for testing complex digital circuitry. The digital testing techniques have utilized the discrete state output signals inherent in digital circuitry as a basis for rendering judgments on the operation of the digital system under test. Complex and rapid testing techniques have been developed to trace circuit faults and to identify defective circuitry.

In digital systems, portions of the system may be subassemblies having analog signal outputs, such as analog signal generators, converters and power supplies. Heretofore automatic test equipment manufacturers have addressed the problem of checking such analog output signals by providing complex, expensive and sophisticated computer-based testers which digitize the analog output signals and then compare the digitized result with a digital data base. Such testing techniques are inherently limited by the size of the data base and speed of circuit response. What is needed is a testing technique which is easily adapted to comparison-type circuit testers particularly useful in a production environment. In particular what is needed is a technique for real-time testing whereby transient failures on an analog circuit can be traced automatically according to rules of logic.

2. Description of the Prior Art

Comparison-type digital logic test techniques are well-known, as for example Giedd, et al. U.S. Pat. No. 3,614,608, and Drabing, et al. U.S. Pat. No. 4,125,763. A comparison-type test system for testing points in a circuit using analog tape recording and storage techniques is disclosed in U.S. Pat. No. 3,522,532.

SUMMARY OF THE INVENTION

According to the invention, complex analog waveforms can be verified in real-time in connection with an automatic digital-type test system by providing simultaneous analog signals from a waveform generator or the like to the input terminals of both a known reference circuit and an unknown circuit unit under test, directing corresponding analog output signals of said reference and unknown to a differential amplifier or subtraction circuit to produce an analog error signal equal to the difference of the analog output signals, comparing the analog error signal against upper and lower threshold limits, or an amplitude "window," preferably having programmable limits, providing a digital decision signal indicating a failure whenever the error signal deviates from the limit window, i.e., exceeds the limits, and selectively providing the digital output signal to data analysis channels of a digital circuit tester whereby the tester can interact with the stimulus signals and the circuit under test to establish the timing and location of the failure.

A key feature of the invention is the ability to disable the test functions at any step in a test sequence so that unsynchronizable conditions generating false failure signals can be ignored.

A further key feature of the system is the ability to program or automatically adjust the limits on the limit window in the course of a test sequence.

As a further feature of the invention, a number of analog output signals can be tested simultaneously and economically according to this invention. Each analog output signal to be verified and its corresponding reference signal are coupled to a single waveform comparator. Accordingly, a bank of waveform comparators according to the invention may be incorporated into an automatic tester.

Following the teachings of this invention, analog systems, as well as integrated digital and analog systems can be tested using automatic digital waveform testers. Suitable testers include Fluke Trendar Models 2000, 2000A, 3020A and 3040A, which are made by Fluke Trendar Corporation of Mountain View, Calif.

The testing technique according to the invention is substantially independent of frequency, depending only upon limitations of the upper frequency capabilities of the circuit components. Thus, a universal digital and analog tester can be constructed according to this invention.

The invention will be better understood by reference to the following detailed description taken in conjunction with the accompanying drawings.

BRIEF DESCRIPTION OF THE DRAWINGS

FIG. 1 is a block diagram of an automatic digital tester incorporating a device for analog waveform analysis according to the invention.

FIG. 2 is a schematic block diagram of a specific embodiment of an analog waveform analysis device according to the invention.

DESCRIPTION OF SPECIFIC EMBODIMENTS

The operation of this invention depends upon the generation of stimulus signals having controlled parameters. Signals having controlled parameters refer to signals whose instantaneous phase and amplitude are known and controlled or otherwise synchronized with system functions through a master clock. The techniques used according to the invention rely on the assumption that identical circuits perform identically when subjected to identical stimuli. The practical limitations of such an assumption are compensated by an ability to adjust the sensitivity of the test apparatus to differences in the amplitude of the output signals of the unit under test. Moreover, devices according to the invention include a capability of ignoring portions of the resultant output signals so as not to interfere with automatic testing functions.

This invention is described in connection with the automatic test equipment of the Fluke Trendar Corporation of Mountain View, Calif. The disclosure of U.S. Pat. No., 4,125,763 is incorporated herein by reference.

Referring to FIG. 1, there is shown a tester 10 according to the invention. The tester 10 includes a processor/controller 12, a function generator 14, an input connector or socket 16 for a known good reference circuit unit 18, an input connector or socket 20 for an unknown circuit unit under test 22, an output connector or socket 24 for the reference unit 18, an output connector or socket 26 for the unit under test 22, a bank dual-input analog signal comparators 28, 29, 30 coupled at the inputs to matched output terminals of the reference unit 18 and the unit under test 22, a bank of limit setting circuits 31, 32, 33 coupled respectively to comparators 28, 29, 30, a bank of digital output signal gates 34, 35, 36 coupled respectively to the outputs of the comparators 28, 29, 30, a data input bus 38 coupled between the outputs of the signal gates 34, 35, 36 and the processor/controller 12, and a control and address bus 40 coupled between the processor/controller 12 and both the limit setting circuits 31, 32, 33 and the signal gates 34, 35, 36.

The processor/controller 12 may be an automatic microprocessor-based tester such as the Fluke Trendar 3040A System Tester. The data input to the processor/controller is by way of the data input bus 38. Control signals are directed to the test equipment by way of the control and address bus 40, as well as by way of a function select line 42 and a clock/enable line 44 coupled to the function generator 14. The function generator 14 may produce a variety of periodic and aperiodic analog signals selected to exercise the circuit or system to be tested. The parameters of the function generator are controlled by means of the function select line 42 and the clock/enable line 44 to assure synchronous operation in connection with the processor/controller 12. The reference unit 18 and unit under test 22 derive their common input from the function generator 14 through the input sockets 16, 20. The corresponding matched outputs of the reference unit 18 and unit under test 22 are coupled in pairs to one of the single analog comparators 28–30. Any number of comparators may be employed according to the desired number of output signals to be simultaneously analyzed. For convenience, the corresponding pairs are designated $R_1$ through $R_3$ and $U_1$ through $U_3$, or simply R and U indicating Reference and Unknown.

Turning to FIG. 2, the analog signal comparator 28 according to the invention is shown in detail. The comparator 28 is substantially identical to comparators 29 and 30. The comparator 28 comprises a subtraction circuit 46, a first limit sensor 48, and second limit sensor 50 and a voltage mirror circuit 52.

The subtraction circuit 46 may comprise a differential amplifier such as a dual-input operational amplifier 54 having its output gain limited by a negative feedback loop 56. A first input line is designated R and a second input line is designated U. The R line and U line are coupled to the differential input at matching impedance levels as determined by input resistors 58, 60.

The operational amplifier 54 should be of a type having an extremely high common mode rejection to assure that the subtraction circuit 46 has the sensitivity suitable to the application.

The subtraction circuit 46 produces an error signal at output 62. The output signal 62 represents the simultaneous arithmetic difference between the R signal and the U signal scaled according to the amplification factor of the subtraction circuit. The output 62 drives the first limit sensor 48 and the second limit sensor 50, as hereinafter explained.

The first limit sensor 48 comprises a voltage level comparator having its first or noninverting input referenced to a positive voltage reference source 33 and its second or inverting input driven by the error output 62. A voltage mirror circuit 52, comprising an operational amplifier 64 provided with a negative feedback loop so that its amplification factor is unity and having its non-inverted input referenced to ground, is operative to invert the positive voltage reference. In this manner, negative voltage reference is provided which is the mirror of the positive voltage reference with respect to ground. The negative voltage reference is provided to the inverting input of the second limit sensor 50.

The noninverting input of the second limit sensor 50 is driven by the error signal of the output terminal 62. The outputs of the first limit sensor 48 and second limit sensor 50 are coupled in a WIRED-OR gate 66, the output 68 of which is a digital signal for indicating differences between the R signal and the U signal exceeding an allowable limit.

The voltages which are used for reference and for setting the digital level are externally supplied. For example, the digital level of the output 68 is set by a fixed digital level voltage $+V_D$ through a pull-up resistor 70 coupled to the outputs of the limit sensors 48, 50.

The voltage reference 33 for the limit sensors 48, 50 is provided through either a fixed voltage reference $+V$ REF (fixed) or through a programmed voltage reference through a limit setting circuit 33. For example, the limit setting circuits may comprise a bank of resistors coupled as a bank of voltage dividing networks which are selectively switched to change the voltage reference level. A simple FET switch may be employed to effect the switching function, the FET switch being controlled by a digital signal supplied through the bus 40 (FIG. 1) from the processor/controller 12. In this manner, the reference level can be set and reset during the operation of the function generator 14.

In order for the circuit to function as intended, means must be provided for selectively propagating the output signal via output 68 back to the processor/controller 12. For this purpose, the gate 34 (FIG. 2) comprising an AND gate responsive to an enable signal from a line of bus 40 is operative to gate the output signal to a selected line of bus 38. Thus, the bus 38 only receives signals from the comparator 28 during selected time sequences or intervals.

According to the invention, the test unit 22 and the reference unit 18 are compared as follows: A selected complex analog waveform signal is generated by the function generator 14 under control of the processor/controller 12 which is supplied to both the reference unit 18 and the circuit unit under test 22. A reference output signal and an unknown output signal are provided at each output of the reference 18 and circuit unit under test 22. The matched or paired reference output signal and the unknown output signal are fed to the subtracting circuit 46 of the comparator 28 where the difference between the signals is determined, and an analog error signal representative of the amplitude of the difference is generated. The error signal is then compared against a limit window defined by an upper amplitude limit signal and a lower amplitude limit signal defined by an external reference, namely +V REF$_3$ 33.

If the error signal is outside of the limit window, a digital level signal so indicating the condition is generated. In the device depicted in FIG. 2, a failure would be indicated by a low signal. The digital signal is propagated to the signal bus 38 whenever an enable signal is issued through bus 40.

The propagation step may be augmented by the addition of other devices such as a bistable multivibrator which stores and gates the signal upon receipt of a command, and switches may be provided for blocking off the circuit, testing the circuit and for clocking the gate.

The invention has now been explained with reference to specific embodiments. Other embodiments incorporating the invention will be suggested to those of ordinary skill in the art. It is therefore not intended that the invention be limited, except as indicated by the appended claims.

What is claimed is:

1. For use in a comparison-type automatic electronic circuit test apparatus capable of generating stimulus signals having controlled parameters, a method for verifying that analog signals generated by a circuit in a device under test are within specified limits comprising the steps of repetitively:
   providing a selected stimulus signal having controlled parameters to input terminals of a known good reference circuit unit and corresponding unknown circuit unit under test in order to stimulate synchronous operation of said reference circuit unit to produce a reference output signal and said circuit unit under test to produce an unknown output signal;
   subtracting said reference output signal from said unknown output signal to produce an analog error signal representative of the amplitude difference between said reference output signal and said unknown output signal;
   comparing said error signal against a limit window defined by an upper amplitude limit signal and a lower amplitude limit signal;
   generating a digital level signal of a first state whenever said error signal is within said limit window in response to said stimulus signal and generating a digital level signal of a second state whenever said error signal is outside said limit window in response to said stimulus signal; and
   selectively propagating said digital level signal to a digitally responsive apparatus in synchronism with said stimulus signal for indicating the failure of said unknown circuit unit.

2. The method as claimed in claim 1 wherein said comparing step further comprises selectively designating said upper amplitude limit signal and said lower amplitude limit signal according to the desired sensitivity of the comparing step during selected propagating steps.

3. The method as claimed in claim 1 wherein said upper amplitude limit signal and said lower amplitude limit signal are predetermined for the duration of the stimulus signal.

4. The method as claimed in claim 1 further including the step of responding to a selectively propagated digital signal indicating failure of said unknown circuit unit to terminate said stimulus signal providing step and to generate a predetermined logical circuit response to said failure indication for determining the source of said failure.

5. In a comparison-type automatic electronic test apparatus having selected input terminals and capable of generating stimulus signals having controlled parameters, a device for testing circuits which generate analog waveform output signals, said device comprising:
   means coupled to a known good reference circuit unit and to an unknown circuit unit under test for generating at preselected input terminals of said reference circuit unit and said circuit unit under test a common analog stimulus signal having controlled parameters such that said reference circuit unit and said circuit unit under test generate a reference output signal and an unknown output signal;
   means coupled to said reference circuit unit and to said circuit unit under test for subtracting said refrence output signal from said unknown output signal to produce an analog error signal representative of the amplitude difference between said reference output signal and said unknown output signal;
   means coupled to said subtracting means for comparing said error signal against a limit window defined by an upper amplitude limit signal and a lower amplitude limit signal and for generating a digital level signal indicating whether said error signal is within said limit window or outside of said limit window; and
   means coupled to said comparing means and adapted to be coupled to said test apparatus for selectively propagating said digital level signal to selected input terminals of said test apparatus for subsequent processing.

6. The device as claimed in claim 5 wherein said subtracting means comprises a differential amplifier.

7. The device as claimed in claim 5 further including means coupled to said comparing means for presetting said limit signal levels.

8. The device as claimed in claim 7 wherein said comparing means further comprises a first difference sensing circuit and a second difference sensing circuit, each said sensing circuit having a first sensing input and a second sensing input, said error signal producing means being coupled to said first sensing input of said first sensing circuit and to said second sensing input of said second sensing circuit, means for producing a first limit signal coupled to said second sensing input of said first sensing circuit and means for producing a second limit signal coupled to said first sensing input of said second sensing circuit.

9. The apparatus as claimed in claim 8 wherein said first limit signal producing means comprises a voltage source and said second limit signal producing means comprises a voltage mirror circuit having its input coupled to said voltage source.

10. The device as claimed in claim 5 wherein said comparing means further comprises means adapted to be coupled to a controller of said automatic test apparatus which in response to signals of said automatic test apparatus selectively designates said limit signals in synchronism with said stimulus signal.

11. The device as claimed in claim 5 wherein said propagating means further comprises means adapted to be coupled to said automatic test apparatus for selectively enabling and disabling said propagating in response to digital signals of said automatic test apparatus.

* * * * *